(12) United States Patent
Yagawa

(10) Patent No.: US 6,434,360 B1
(45) Date of Patent: Aug. 13, 2002

(54) RADIO COMMUNICATION APPARATUS

(75) Inventor: Kenichiro Yagawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/305,211

(22) Filed: May 5, 1999

(30) Foreign Application Priority Data

May 8, 1998 (JP) .......................................... 10-125135

(51) Int. Cl.⁷ ................................................ H04H 1/00
(52) U.S. Cl. .................... 455/3.02; 455/12.1; 455/13.1; 455/234.1
(58) Field of Search .............................. 455/3.02, 12.1, 455/13.1, 126, 127, 129, 103, 232.1, 234.1, 235.1

(56) References Cited

U.S. PATENT DOCUMENTS

| | | | | |
|---|---|---|---|---|
| 5,659,892 A | * | 8/1997 | Soleimani et al. | 455/103 |
| 5,724,645 A | * | 3/1998 | Na | 455/3.02 |
| 5,745,084 A | * | 4/1998 | Lusignan | 343/781 P |
| 5,754,949 A | * | 5/1998 | Kumagai et al. | 455/115 |
| 5,809,420 A | * | 9/1998 | Ichiyanagi et al. | 455/103 |
| 5,995,812 A | * | 11/1999 | Soleimani et al. | 455/119 |

FOREIGN PATENT DOCUMENTS

| | | | |
|---|---|---|---|
| JP | 59-3643 | 1/1984 | |
| JP | 62-268284 | 11/1987 | |
| JP | 02-305010 | 12/1990 | |
| JP | 2305010 | * 12/1990 | ............. H03G/3/20 |
| JP | 409284185 A | * 10/1997 | ........... H04B/7/005 |
| JP | 09-321523 | 12/1997 | |

* cited by examiner

Primary Examiner—Edward F. Urban
Assistant Examiner—Temica M. Davis
(74) Attorney, Agent, or Firm—Sughrue Mion, PLLC

(57) ABSTRACT

A radio communication apparatus transmits signals between an outdoor unit and an indoor unit which are connected to each other through a cable. This apparatus includes a variable level adjustment circuit in the indoor unit. In the apparatus, the fixed level difference of a reception signal due to the installation parameters of a reception system is eliminated, and the reception signal is adjusted to make the reception signal level become equal to a predetermined standard input level.

22 Claims, 1 Drawing Sheet

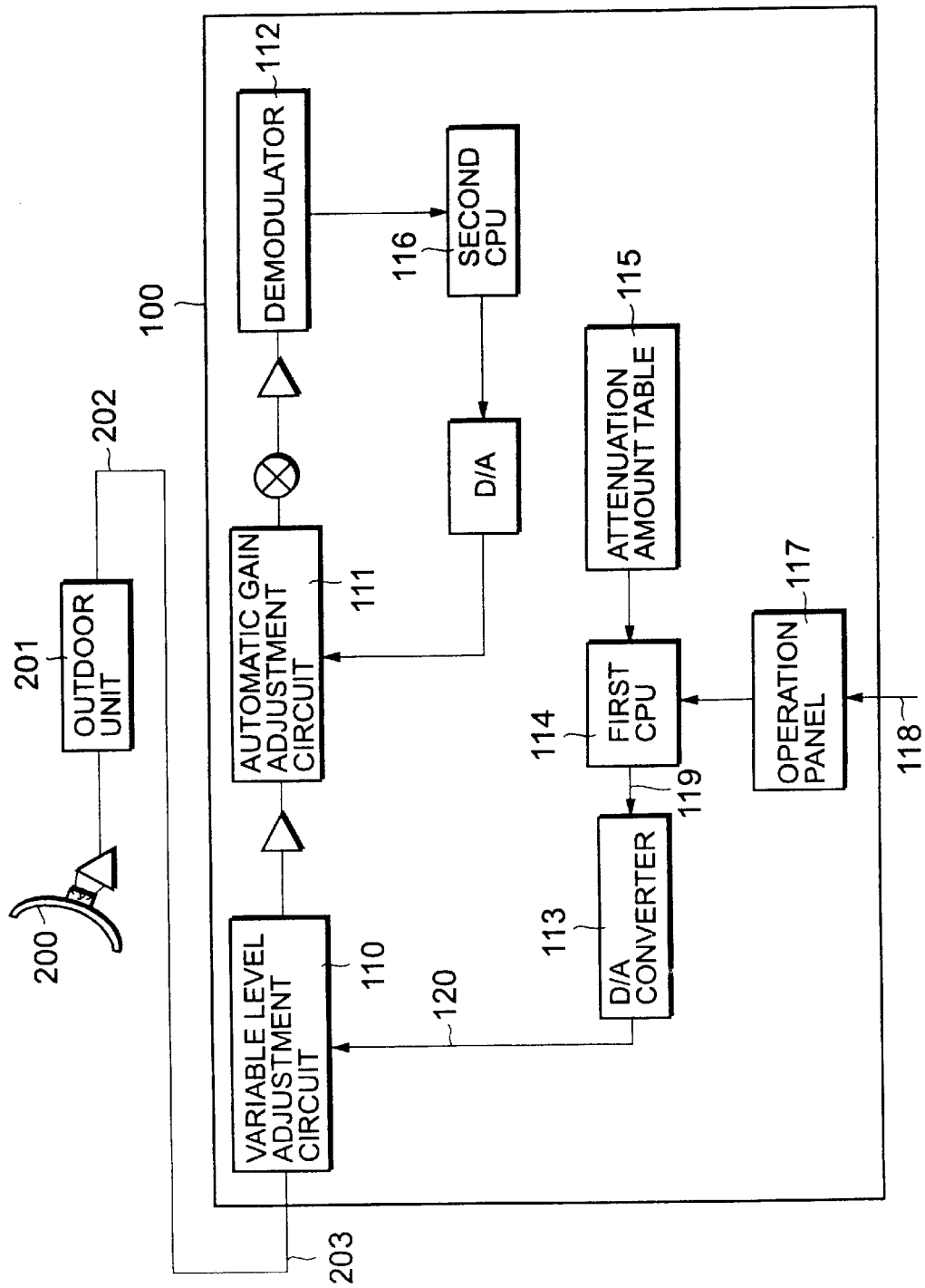

RADIO COMMUNICATION APPARATUS

BACKGROUND OF THE INVENTION

1. Field of the Invention

The present invention relates to a radio communication apparatus for transmitting signals between an outdoor unit and an indoor unit which are connected through a cable and, more particularly, to a radio communication apparatus capable of adjusting the level of a reception signal by inputting reception system installation parameters.

2. Description of the Prior Art

Reception signal level adjustment generally adopted in a very small aperture terminal (VSAT) or the like in a conventional radio communication apparatus is performed as follows. The demodulator of an outdoor unit compares a demodulated reception signal with the reference signal set in the modulator. The input level of the reception signal at the input point of an indoor unit is then controlled such that the difference between the reception signal and the reference signal falls within a predetermined range.

The signal output from the demodulator is input to a CPU. The signal is then coded by using a predetermined conversion table and output in a D/A format. The signal output from the CPU is converted into a control signal for a level adjustment PIN diode by the D/A converter. The attenuation amount of the PIN diode is changed in accordance with this signal to adjust the reception signal level. Since the level adjustment PIN diode is located at the input point of the indoor unit, the reception signal level of the indoor unit is kept constant.

The following problem, however, is posed in the conventional radio communication apparatus.

In reception signal level adjustment generally adopted in a very small aperture terminal (VSAT) or the like, since one level adjustment circuit is used to eliminate a fixed level difference based on the installation parameters associated with the indoor unit and variation level difference due to rainfall attenuation or inter-terminal deviation, an automatic gain adjustment circuit needs to have an excessive dynamic range. As a result, the subsequent circuit arrangement becomes complicated.

SUMMARY OF THE INVENTION

The present invention has been made in consideration of the above situation in the prior art, and has as its object to provide a radio communication apparatus which can reduce the dynamic range of an automatic gain adjustment circuit with respect to a variation level difference due to rainfall attenuation or an inter-terminal deviation by eliminating a fixed level difference, and can simplify the circuit arrangement on the subsequent stage.

In order to achieve the above object, according to the main aspect of the present invention, there is provided a radio communication apparatus for transmitting a signal between an outdoor unit and an indoor unit which are connected to each other through a cable, comprising a variable level adjustment circuit in the indoor unit, wherein a fixed level difference of a reception signal due to installation parameters of a reception system is eliminated, and the reception signal is adjusted to make a reception signal level become equal to a predetermined standard input level.

According to the first auxiliary aspect of the present invention, the indoor unit comprises an operation panel for setting/inputting the installation parameters.

According to the second auxiliary aspect of the present invention, the indoor unit in the principal aspect comprises a CPU for calculating a fixed level difference of a reception signal in accordance with the installation parameters and outputting a control signal for adjusting the reception signal in the variable level adjustment circuit.

According to the third auxiliary aspect of the present invention, the CPU in the second auxiliary aspect calculates the fixed level difference of the reception signal at an indoor unit input point in accordance with the installation parameters.

According to the fourth auxiliary aspect of the present invention, the CPU in the second auxiliary aspect is connected to a table in which attenuation and amplification amounts are set in advance with respect to the installation parameters.

According to the first auxiliary aspect, in the principal aspect and the respective auxiliary aspects, the installation parameters include at least an antenna diameter of an antenna connected to the outdoor unit, a type of the outdoor unit, and a type and length of the cable.

In the radio communication apparatus of the present invention for transmitting a signal between an outdoor unit and an indoor unit which are connected to each other through a cable, the indoor unit includes a variable level adjustment circuit. In this apparatus, a fixed level difference of a reception signal due to installation parameters of a reception system is eliminated, and the reception signal is adjusted to make a reception signal level become equal to a predetermined standard input level. With this arrangement, the dynamic range of the automatic gain adjustment circuit with respect to a variation level difference caused by rainfall attenuation, an inter-terminal deviation, or the like can be reduced, and both the arrangement of the automatic gain adjustment circuit itself and the subsequent circuit arrangement can be simplified.

The indoor unit comprises an operation panel for setting/inputting the installation parameters. Therefore, the installation parameters can be easily set, and the circuit arrangement can be simplified.

The indoor unit comprises a CPU for calculating a fixed level difference of a reception signal in accordance with the installation parameters and outputting a control signal for adjusting the reception signal in the variable level adjustment circuit. With a simple arrangement, therefore, a control signal for adjusting a reception signal can be output, and the circuit arrangement can be simplified.

The CPU calculates the fixed level difference of the reception signal at an indoor unit input point in accordance with the installation parameters. With this operation, the fixed level difference of the reception signal can be accurately calculated, and the circuit arrangement can be simplified.

The CPU is connected to a table in which attenuation and amplification amounts are set in advance with respect to the installation parameters. With this arrangement, the fixed level difference of the reception signal can be accurately calculated, and the circuit arrangement can be simplified.

The installation parameters include at least an antenna diameter of an antenna connected to the outdoor unit, a type of the outdoor unit, and a type and length of the cable. Therefore, the installation parameters can be set in accordance with the radio communication apparatus, and the circuit arrangement can be simplified.

The above and many other objects, features and advantages of the present invention will become manifest to those skilled in the art upon making reference to the following detailed description and accompanying drawings in which preferred embodiments incorporating the principle of the present invention are shown by way of an illustrative example.

BRIEF DESCRIPTION OF THE DRAWING

FIGURE is a block diagram schematically showing the overall arrangement of a very small aperture terminal (VSAT) in a radio communication apparatus according to the present invention.

DETAILED DESCRIPTION OF PREFERRED EMBODIMENTS

A preferred embodiment of the present invention will be described below with reference to the accompanying drawing.

FIGURE is a block diagram schematically showing the overall arrangement of a very small aperture terminal in the radio communication apparatus of the present invention. A very small aperture terminal (VSAT) is comprised of an antenna 200, an outdoor unit 201 connected to the antenna 200, and an indoor unit 100 connected to the outdoor unit 201 through an IFL cable 202.

A reception signal 203 received by the antenna 200 is input from the outdoor unit 201 to the indoor unit 100 through the IFL cable 202. The level of reception signal 203 input to the indoor unit 100 is adjusted by a variable level adjustment circuit 110 in accordance with a control voltage 120. The reception signal is then subjected to gain adjustment in an automatic gain adjustment circuit 111. The resultant signal is input to a demodulator to be demodulated.

The control voltage 120 is output from a first CPU 114 through a D/A converter 113. The first CPU 114 is connected to a table 115 and an operation panel 117. With the operation panel 117, installation parameters 118 such as the type of the outdoor unit 201 and the type and length of the IFL cable 202 are set/input. The set installation parameters 118 are loaded by the first CPU 114. The first CPU 114 then calculates a total level attenuation amount (or amplification amount) by using the table 115 of level attenuation and amplification amounts with respect to the installation parameters 118.

In addition, a reference value is set in advance to make the level of the reception signal 203 become equal to a standard input level at a predetermined input point of the indoor unit 100 in accordance with the total level attenuation amount (or amplification amount). The first CPU 114 calculates the attenuation amount required to eliminate the level difference between the reception signal and this reference value. This attenuation amount is coded by using the conversion table and output in a D/A format. A control signal 119 converted into the D/A format is converted into the control voltage 120 for the variable level adjustment circuit 110 by the D/A converter 113. The input level of the reception signal is adjusted by the variable level adjustment circuit 110 in accordance with the control voltage 120.

The reception signal 203 adjusted by the variable level adjustment circuit 110 is input to a demodulator 112 through the automatic gain adjustment circuit 111 to be demodulated. The output from the demodulator 112 is input to a second CPU 116. The output is then converted into a control voltage by a D/A converter. The control voltage is input to the automatic gain adjustment circuit 111 to perform feedback control to make the reception signal level become equal to a predetermined signal level.

As described above, by setting the installation parameters 118 with the operation panel 117 of the indoor unit, the fixed level difference of the reception signal 203 due to the type of the outdoor unit 201, the type and length of the IFL cable 202, and the like can be eliminated, and the dynamic range of the automatic gain adjustment circuit on the subsequent stage with respect to the variable level difference due to rainfall attenuation, an inter-terminal deviation, or the like can be reduced. Therefore, the arrangement of the automatic gain adjustment circuit itself can be simplified, and the subsequent circuit arrangement can also be simplified.

Note that the numbers of types of antennas and outdoor units of very small aperture terminals (VSATs) are on the increase, and the reception signal level differences at the input points of the indoor units tend to increase. However, since a reception signal level difference is not associated with a variation level difference, both the arrangement of the automatic gain adjustment circuit and the arrangement of the subsequent circuit arrangement can be simplified by removing the fixed level difference.

What is claimed is:

1. A radio communication apparatus for transmitting a signal between an outdoor unit and an indoor unit which are connected to each other through a cable, comprising:

a variable level adjustment circuit in said indoor unit wherein a fixed level difference of a reception signal due to installation parameters of a reception system is eliminated, and the reception signal is adjusted to make a reception signal level become equal to a predetermined standard input level; and a second level adjustment circuit that eliminates a second level difference in said reception signal, wherein said indoor unit comprises a CPU for calculating a fixed level difference of a reception signal in accordance with the installation parameters and outputting a control signal for adjusting the reception signal in said variable level adjustment circuit.

2. An apparatus according to claim 1, wherein said CPU calculates the fixed level difference of the reception signal at an indoor unit input point in accordance with the installation parameters.

3. A radio communication apparatus for transmitting a signal between an outdoor unit and an indoor unit which are connected to each other through a cable, comprising:

a variable level adjustment circuit in said indoor unit, wherein a fixed level difference of a reception signal due to installation parameters of a reception system is eliminated, and the reception signal is adjusted to make a reception signal level become equal to a predetermined standard input level; and a second level adjustment circuit that eliminates a second level difference in said reception signal, wherein said indoor unit comprises an operation panel for setting/inputting the installation parameters, wherein said indoor unit comprises a CPU for calculating a fixed level difference of a reception signal in accordance with the installation parameters and outputting a control signal for adjusting the reception signal in said variable level adjustment circuit.

4. An apparatus according to claim 3, wherein said CPU calculates the fixed level difference of the reception signal at an indoor unit input point in accordance with the installation parameters.

5. A radio communication apparatus for transmitting a signal between an outdoor unit and an indoor unit which are connected to each other through a cable, comprising:

a variable level adjustment circuit in said indoor unit,
wherein a fixed level difference of a reception signal
due to installation parameters of a reception system is
eliminated, and the reception signal is adjusted to make
a reception signal level become equal to a predetermined standard input level, and wherein said indoor unit comprises a CPU for calculating a fixed level difference of the reception signal in accordance with the installation parameters and outputting a control signal for adjusting the reception signal in said variable level adjustment circuit, and wherein said CPU is connected to a table in which attenuation and amplification amounts are set in advance with respect to the installation parameters.

6. An apparatus according to claim 5, wherein the installation parameters include at least an antenna diameter of an antenna connected to said outdoor unit, a type of said outdoor unit, and a type and length of said cable.

7. A radio communication apparatus for transmitting a signal between an outdoor unit and an indoor unit which are connected to each other through a cable, comprising:

a variable level adjustment circuit in said indoor unit, wherein a fixed level difference of a reception signal due to installation parameters of a reception system is eliminated, and the reception signal is adjusted to make a reception signal level become equal to a predetermined standard input level, and wherein said indoor unit comprises a CPU for calculating a fixed level difference of the reception signal in accordance with the installation parameters and outputting a control signal for adjusting the reception signal in said variable level adjustment circuit, and wherein said CPU calculates the fixed level difference of the reception signal at an indoor unit input point in accordance with the installation parameters, and wherein said CPU is connected to a table in which attenuation and amplification amounts are set in advance with respect to the installation parameters.

8. A radio communication apparatus for transmitting a signal between an outdoor unit and an indoor unit which are connected to each other through a cable, comprising:

a variable level adjustment circuit in said indoor unit, wherein a fixed level difference of a reception signal due to installation parameters of a reception system is eliminated, and the reception signal is adjusted to make a reception signal level become equal to a predetermined standard input level, and wherein the installation parameters include at least an antenna diameter of an antenna connected to said outdoor unit, a type of said outdoor unit, and a type and length of said cable.

9. A radio communication apparatus for transmitting a signal between an outdoor unit and an indoor unit which are connected to each other through a cable, comprising:

a variable level adjustment circuit in said indoor unit, wherein a fixed level difference of a reception signal due to installation parameters of a reception system is eliminated, and the reception signal is adjusted to make a reception signal level become equal to a predetermined standard input level, and wherein said indoor unit comprises an operation panel for setting/inputting the installation parameters, and wherein the installation parameters include at least an antenna diameter of an antenna connected to said outdoor unit, a type of said outdoor unit, and a type and length of said cable.

10. A radio communication apparatus for transmitting a signal between an outdoor unit and an indoor unit which are connected to each other through a cable, comprising:

a variable level adjustment circuit in said indoor unit, wherein a fixed level difference of a reception signal due to installation parameters of a reception system is eliminated, and the reception signal is adjusted to make a reception signal level become equal to a predetermined standard input level, and wherein said indoor unit comprises a CPU for calculating a fixed level difference of the reception signal in accordance with the installation parameters and outputting a control signal for adjusting the reception signal in said variable level adjustment circuit, and wherein the installation parameters include at least an antenna diameter of an antenna connected to said outdoor unit, a type of said outdoor unit, and a type and length of said cable.

11. A radio communication apparatus for transmitting a signal between an outdoor unit and an indoor unit which are connected to each other through a cable, comprising:

a variable level adjustment circuit in said indoor unit, wherein a fixed level difference of a reception signal due to installation parameters of a reception system is eliminated, and the reception signal is adjusted to make a reception signal level become equal to a predetermined standard input level, and wherein said indoor unit comprises a CPU for calculating a fixed level difference of the reception signal in accordance with the installation parameters and outputting a control signal for adjusting the reception signal in said variable level adjustment circuit, and wherein said CPU calculates the fixed level difference of the reception signal at an indoor unit input point in accordance with the installation parameters, and wherein the installation parameters include at least an antenna diameter of an antenna connected to said outdoor unit, a type of said outdoor unit, and a type and length of said cable.

12. A radio communication apparatus for transmitting a signal between an outdoor unit and an indoor unit which are connected to each other through a cable, comprising:

a variable level adjustment circuit in said indoor unit wherein a fixed level difference of a reception signal due to installation parameters of a reception system is eliminated, and the reception signal is adjusted to make a reception signal level become equal to a predetermined standard input level; and a second level adjustment circuit that eliminates a second level difference in said reception signal, wherein said installation parameters comprise a type of said outdoor unit.

13. A radio communication apparatus for transmitting a signal between an outdoor unit and an indoor unit which are connected to each other through a cable, comprising:

a variable level adjustment circuit in said indoor unit, wherein a fixed level difference of a reception signal due to installation parameters of a reception system is eliminated, and the reception signal is adjusted to make a reception signal level become equal to a predetermined standard input level; and a second level adjustment circuit that eliminates a second level difference in said reception signal, wherein said installation parameters comprise a type of said cable.

14. A radio communication apparatus for transmitting a signal between an outdoor unit and an indoor unit which are connected to each other through a cable, comprising:

a variable level adjustment circuit in said indoor unit, wherein a fixed level difference of a reception signal due to installation parameters of a reception system is eliminated, and the reception signal is adjusted to make a reception signal level become equal to a predetermined standard input level; and a second level adjustment circuit that eliminates a second level difference in said reception signal,
wherein said second level difference is a variable level difference due to variable parameters, and
wherein said variable parameters are different than said installation parameters.

15. The apparatus according to claim 14, wherein said variable parameters comprise a rainfall attenuation parameter.

16. The apparatus according to claim 14, wherein said variable parameters comprise an inter-terminal deviation parameter.

17. A radio communication apparatus for transmitting a signal between an indoor unit and an outdoor unit, comprising:

a first level adjustment circuit in said indoor unit, wherein said first level adjustment circuit eliminates a first level difference in said signal; and a second level adjustment circuit in said indoor unit, wherein said second level adjustment circuit eliminates a second level difference in said signal,
wherein said first level adjustment signal is due to a first parameter and said second level adjustment circuit is due to a second parameter, and
wherein said first parameter is different than said second parameter,
wherein said first parameter is an installation parameter, and
wherein said installation parameter comprises a type of said outdoor unit.

18. A radio communication apparatus for transmitting a signal between an indoor unit and an outdoor unit, comprising:

a first level adjustment circuit in said indoor unit, wherein said first level adjustment circuit eliminates a first level difference in said signal; and a second level adjustment circuit in said indoor unit, wherein said second level adjustment circuit eliminates a second level difference in said signal,
wherein said first level adjustment signal is due to a first parameter and said second level adjustment circuit is due to a second parameter, and
wherein said first parameter is different than said second parameter,
wherein said first parameter is an installation parameter,
wherein said indoor unit and said outdoor unit are connected via a cable, and
wherein said installation parameter comprises a type of said cable connecting said indoor unit and said outdoor unit.

19. A radio communication apparatus for transmitting a signal between an indoor unit and an outdoor unit, comprising:

a first level adjustment circuit in said indoor unit, wherein said first level adjustment circuit eliminates a first level difference in said signal; and a second level adjustment circuit in said indoor unit, wherein said second level adjustment circuit eliminates a second level difference in said signal,
wherein said first level adjustment signal is due to a first parameter and said second level adjustment circuit is due to a second parameter,
wherein said first parameter is different than said second parameter, and
wherein said second parameter is a variable parameter.

20. The apparatus according to claim 19, wherein said variable parameter comprises rainfall attenuation.

21. The apparatus according to claim 19, wherein said variable parameter comprises inter-terminal deviation.

22. A radio communication apparatus for transmitting a signal between an indoor unit and an outdoor unit, comprising:

a first level adjustment circuit in said indoor unit, wherein said first level adjustment circuit eliminates a first level difference in said signal; and a second level adjustment circuit in said indoor unit, wherein said second level adjustment circuit eliminates a second level difference in said signal,
wherein said first level adjustment signal is due to a first parameter and said second level adjustment circuit is due to a second parameter,
wherein said first parameter is different than said second parameter,
wherein said first level adjustment circuit comprises a variable level adjustment circuit, and
wherein said second level adjustment circuit comprises an automatic gain adjustment circuit.

\* \* \* \* \*